(12) United States Patent
Song et al.

(10) Patent No.: US 9,114,989 B2
(45) Date of Patent: Aug. 25, 2015

(54) INERT GAS RECOVERY AND RECYCLE FOR SILICON CRYSTAL GROWTH PULLING PROCESS

(71) Applicants: Lingyan Song, Brookfield, CT (US); Lloyd Anthony Brown, East Amherst, NY (US)

(72) Inventors: Lingyan Song, Brookfield, CT (US); Lloyd Anthony Brown, East Amherst, NY (US)

(73) Assignee: PRAXAIR TECHNOLOGY, INC., Danbury, CT (US)

( * ) Notice: Subject to any disclaimer, the term of this patent is extended or adjusted under 35 U.S.C. 154(b) by 321 days.

(21) Appl. No.: 13/693,673

(22) Filed: Dec. 4, 2012

(65) Prior Publication Data

US 2013/0149226 A1 Jun. 13, 2013

Related U.S. Application Data

(60) Provisional application No. 61/568,010, filed on Dec. 7, 2011.

(51) Int. Cl.

| | |
|---|---|
| *C01B 23/00* | (2006.01) |
| *C30B 15/00* | (2006.01) |
| *C30B 15/20* | (2006.01) |
| *C30B 29/06* | (2006.01) |
| *F25J 3/08* | (2006.01) |

(52) U.S. Cl.
CPC ......... *C01B 23/0094* (2013.01); *C01B 23/0021* (2013.01); *C30B 15/00* (2013.01); *C30B 15/20* (2013.01); *C30B 29/06* (2013.01); *F25J 3/08* (2013.01); *C01B 2210/0004* (2013.01); *C01B 2210/005* (2013.01); *C01B 2210/007* (2013.01); *C01B 2210/0034* (2013.01); *C01B 2210/0045* (2013.01); *C01B 2210/0053* (2013.01); *C01B 2210/0098* (2013.01); *F25J 2200/02* (2013.01);

(Continued)

(58) Field of Classification Search
CPC ........ B01D 2257/55; F25J 3/08; C01B 13/20; C01B 23/0021; C01B 23/0094; C01B 33/037; C01B 33/039; C01B 33/12; C01B 33/182; C01B 2210/0004; C01B 2210/0034; C01B 2210/0045; C01B 2210/0051; C01B 2210/0005; C01B 2210/007; C01B 2210/0098; C30B 15/00; C30B 15/007; C30B 15/20; C30B 29/06; Y02C 10/12
See application file for complete search history.

(56) References Cited

U.S. PATENT DOCUMENTS

| | | |
|---|---|---|
| 5,106,399 A | 4/1992 | Fisher |
| 5,706,674 A | 1/1998 | Hsiung et al. |

(Continued)

FOREIGN PATENT DOCUMENTS

| | | |
|---|---|---|
| EP | 0 956 928 A1 | 11/1999 |
| JP | 2000-088455 | 3/2000 |
| WO | WO 2011/045186 A1 | 4/2011 |

*Primary Examiner* — Anthony J Zimmer
*Assistant Examiner* — Justin Bova
(74) *Attorney, Agent, or Firm* — Nilay S. Dalal

(57) ABSTRACT

This invention is directed to a method for recovering, purifying and recycling an inert gas on a continual basis in connection with a silicon crystal pulling process. Silicon oxide impurities generated during the crystal growth process are completely oxidized by in-situ oxidation with a regulated amount of an oxidizing source gas mixture to form silicon dioxide impurities, which can be removed by a particulate removal device. The particulate-free effluent enters a purification unit to remove the remaining impurities. The inert gas emerging from the purification unit can be fed back into the crystal puller apparatus and/or mixed with the oxidizing source gas mixture. As a result, the ability to increase silicon crystal throughput, quality and at the same time reduce the costs associated with recycling the inert gas can be achieved.

18 Claims, 7 Drawing Sheets

(52) U.S. Cl.
CPC ........... *F25J 2205/40* (2013.01); *F25J 2205/50* (2013.01); *F25J 2205/82* (2013.01); *F25J 2215/30* (2013.01); *F25J 2215/58* (2013.01); *F25J 2245/02* (2013.01); *F25J 2245/58* (2013.01); *Y02C 10/12* (2013.01)

(56) References Cited

U.S. PATENT DOCUMENTS

| | | | |
|---|---|---|---|
| 5,783,162 | A | 7/1998 | Tomita et al. |
| 6,039,801 | A | 3/2000 | Holder et al. |
| 6,113,869 | A | 9/2000 | Jain et al. |
| 6,123,909 | A | 9/2000 | Yamamoto et al. |
| 6,217,633 | B1 | 4/2001 | Ohmi et al. |
| 6,315,828 | B1 | 11/2001 | Holder et al. |
| 6,395,249 | B1 * | 5/2002 | Kondo et al. ............ 423/349 |
| 6,500,235 | B2 | 12/2002 | Zhong et al. |
| 6,685,903 | B2 | 2/2004 | Wong et al. |
| 6,838,066 | B2 | 1/2005 | Rao |
| 7,361,316 | B2 | 4/2008 | Rao |
| 7,862,645 | B2 | 1/2011 | Whitley et al. |

* cited by examiner

US 9,114,989 B2

INERT GAS RECOVERY AND RECYCLE FOR SILICON CRYSTAL GROWTH PULLING PROCESS

The present application claims priority from U.S. Application Ser. No. 61/568,010, filed Dec. 7, 2011, which is incorporated by reference herein in its entirety.

FIELD OF THE INVENTION

This invention relates to a method for the recovery and purification of inert gases employed in the growth of silicon crystals by a crystal pulling process.

BACKGROUND OF THE INVENTION

Monocrystalline silicon is typically the starting material for the fabrication of semiconductor electronic components and solar cells. The monocrystalline silicon is commonly prepared by the Czochralski process, which involves charging polycrystalline silicon into a quartz crucible contained within a crystal pulling chamber. The polycrystalline silicon is melted to create a Si melt. A seed crystal is subsequently immersed into the molten silicon, and a monocrystalline silicon ingot is gradually grown by slow extraction of the ingot from the melt.

During the crystal growth, substantial amounts of silicon-containing impurities, such as gaseous silicon monoxide SiO (g) and silicon vapor Si(g), are typically produced and released into the atmosphere within the pulling chamber. Silicon monoxide SiO(g) is generated as a result of oxygen dissolving from the quartz crucible and reacting with the Si melt, as well as interaction of the crucible with graphite susceptor supports. Because silicon monoxide SiO(g) is unstable, it can readily react with other molecules of SiO(g) produced from the crucible dissolution to produce silicon dioxide $SiO_2(s)$ and elemental silicon Si(s). Additionally, because there is a limited amount of oxygen in the chamber, some of the SiO(g) is partially oxidized to form solid $SiO_x(s)$ particulates, where x is less than 2.

Formation of solid particulates of $SiO_x(s)$, $SiO_2(s)$ and elemental silicon Si(s) is a major problem in the crystal pulling industry. The particulates tend to stick and become attached to many parts of the pulling apparatus and exhaust system. The solid particulates can also deposit onto the Si melt if they are not removed, thereby preventing successful monocrystalline growth. Therefore, an inert gas is commonly introduced into the growth chamber to purge the silicon-containing impurities from the growth chamber into the exhaust. Argon gas is typically employed as the inert purge gas, as it is currently the most abundant and the least expensive of the noble gases.

However, while argon is the least expensive of the noble gases, it must be supplied to the crystal growth chamber at high purity levels to avoid contaminating the silicon melt. High-purity argon is generally produced in an air separation plant through a cryogenic distillation process, which is a relatively energy intensive and expensive process. Consequently, the requirement for high-purity argon in the crystal pulling process increases the overall operating costs for the silicon crystal pulling process. High flows of inert gas are required during the purging of impurities from within the crystal pullers, which results in the consumption of large amounts of argon in the crystal pulling apparatus, further adding to the operating costs.

To offset such costs, recycling of the argon gas used in crystal pulling has been attempted. However, the recycling of argon has not proven to be cost effective because the argon effluent from the Si crystal pullers contains impurities such as carbon oxides ($CO/CO_2$), nitrogen ($N_2$), oxygen ($O_2$), hydrogen ($H_2$) and volatile hydrocarbons and the separation process to remove these impurities remains relatively expensive. In particular, the removal of nitrogen and hydrocarbons requires the use of cryogenic distillation since the concentration of nitrogen must be reduced to single-digit ppm levels in the recycled inert gas prior to being re-introduced into the growth chamber for the next cycle. Otherwise, nitrogen can react with the silicon melt to form silicon nitride, which is considered an impurity.

Solid $SiO_x(s)$ is unstable and can rapidly react with oxygen in an exothermic reaction to produce substantial heat if the crystal growth chamber and exhaust system are opened to the atmosphere after ingot growth, which is a safety hazard that can cause system damage and/or injury to personnel due to the potential for rapid pressure increase and release of heat. To overcome this danger the industry has typically employed a post-oxidation step which involves backfilling the evacuated crystal puller with air at a slow flow rate. The oxygen in the air slowly reacts with and fully oxidizes the $SiO_x$ to $SiO_2$ in a controlled manner, thereby reducing the risk of over-pressurization and release of a substantial amount of heat. However, the post-oxidation step can take up to 24 hours to achieve, thereby adding considerable time to complete the silicon crystal pulling cycle before a new cycle can begin. Such a lag time substantially decreases silicon ingot throughput.

The ability to reduce the post-oxidation period and at the same time reduce the operating and production costs associated with purging impurities from the growth chamber without intentionally increasing impurities in the argon effluent is desirable. Other aspects of the present invention will become apparent to one of ordinary skill in the art upon review of the specification, drawings, and claims appended hereto.

SUMMARY OF THE INVENTION

The present invention utilizes a specific protocol for providing a stream of an oxidizing source gas mixture for a silicon crystal pulling apparatus. A stream of the oxidizing source is introduced into a stream of a purge gas used to sweep impurities produced during a silicon crystal growth process. The impurities comprise silicon oxide impurities, which are substantially completely oxidized to silicon dioxide particulates. The oxidizing source gas is regulated to ensure that nitrogen levels are below required purge gas specifications for the silicon crystal growth process. The purge gas stream from the crystal puller containing purge gas from the puller along with unreacted gases from the oxidizing source gas mixture can be purified and recycled to the crystal puller.

In a first aspect of the invention, a process for supplying a stream of an oxidizing source gas mixture for a silicon crystal pulling apparatus is provided. A stream of the oxidizing source gas mixture is introduced into a stream of inert purge gas comprising silicon oxide impurities generated from the crystal pulling apparatus. Substantially all of the silicon oxide impurities in the inert purge gas stream are oxidized to produce silicon dioxide particulates. The silicon dioxide particulates are removed within a conditioning unit located downstream of the crystal pulling apparatus. The nitrogen content in the oxidizing source gas mixture is regulated to below a predetermined threshold.

In accordance with another aspect of the invention, a method for purifying and recycling argon into a silicon crystal pulling apparatus is provided. An impure argon stream is withdrawn from a hot zone of the silicon crystal pulling apparatus. The impurities comprise silicon oxides, hydrocarbons, carbon monoxide and hydrogen generated from the silicon crystal pulling apparatus. A controlled flow of an oxidizing source gas mixture is injected into the impure argon stream. The oxidizing source gas mixture is characterized by a nitrogen concentration of less than a predetermined threshold. Substantially all silicon oxide impurities in the impure argon stream are oxidized to produce silicon dioxide particulates. The particulates are removed in a conditioning unit. A nitrogen concentration of the impure argon stream is regulated prior to entering a purification unit. An oxygen concentration of the impure argon stream is regulated prior to entering a purification unit. The hydrocarbons, carbon monoxide and hydrogen are oxidized to produce oxidized impurities comprising water and carbon dioxide. The oxidized impurities and the excess $O_2$ are removed to generate a purified stream of argon. At least a portion of the purified stream of argon from the purification unit is recycled back into the crystal pulling apparatus.

In accordance with another aspect of the present invention, a method for purifying and recycling an inert gas into a plurality silicon crystal pulling apparatuses is provided. An impure inert gas stream is withdrawn from a hot zone of each of the plurality of silicon crystal pulling apparatuses. The impurities comprise silicon oxides, hydrocarbons, carbon monoxide and hydrogen generated from the silicon crystal pulling apparatus. A controlled flow of an oxidizing source gas mixture is regulated into the impure inert gas stream. The oxygen is present in a stoichiometric excess amount relative to the silicon oxides. Substantially all silicon oxide impurities of the impure inert gas stream are oxidized into silicon dioxide particulates. The particulates are removed in a conditioning unit. The nitrogen concentration and oxygen concentration of the impure inert gas stream are regulated prior to entering a purification unit. The impurities are removed in the purification unit. At least a portion of the purified inert gas stream is recycled from the purification unit back into the crystal pulling apparatus.

BRIEF DESCRIPTION OF THE DRAWINGS

The objects and advantages of the invention will be better understood from the following detailed description of the preferred embodiments thereof in connection with the accompanying figures wherein like numbers denote same features throughout and wherein.

DETAILED DESCRIPTION OF THE INVENTION

As used herein and throughout the specification, all concentrations are expressed as volumetric percentages, unless indicated otherwise. As used herein and throughout the specification, the term "silicon oxide(s)" refers to any silicon oxide impurity that has not undergone complete oxidation to silicon dioxide. "Silicon oxide(s)" will be used interchangeably with $SiO_x$, where x is less than 2.

Figure 1:
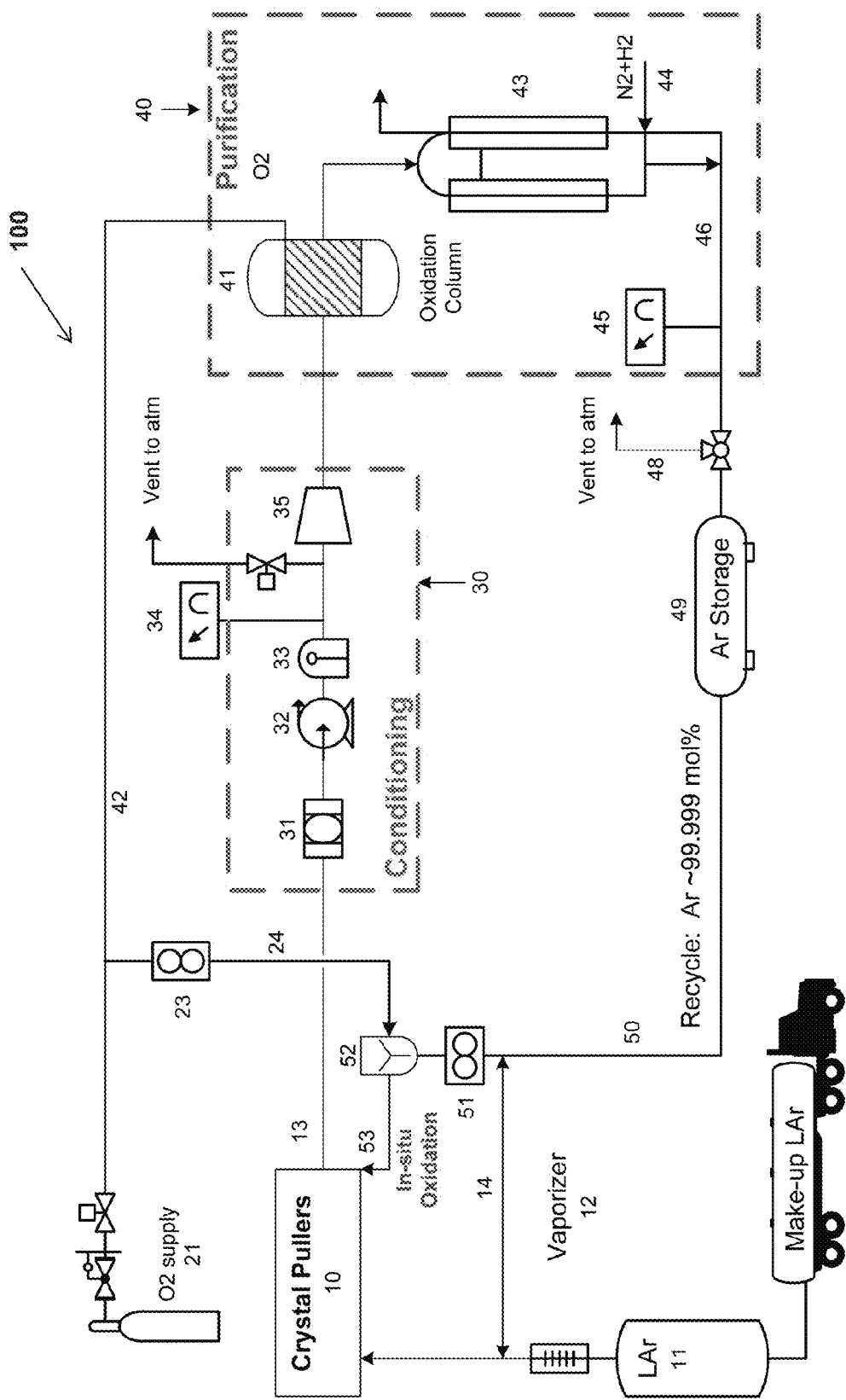
FIG. 1 shows a process incorporating the principles of the invention in which oxygen and recycled, purified argon are mixed for in-situ oxidation of silicon oxide impurities generated from the crystal pulling process.

FIG. 1 shows a crystal pulling process in which an inert, purge gas can be continuously utilized by being processed through a purification and recycle system 100 in accordance with an embodiment of the present invention. Silicon-containing impurities are generated as by-products in one or more crystal pullers 10 during the growth of monocrystalline silicon ingots. The silicon-containing impurities (e.g., $SiO_x$ (g)) are purged from the crystal pullers 10 by introduction of the inert, purge gas therewithin. Silicon-containing impurities, include, but are not limited to $SiO_x(g)$. The purge gas is injected into the pullers 10 to sweep the silicon-containing impurities generated during the crystal growth process from out of the pullers 10. Any suitable inert purge gas can be employed and is contemplated. Preferably, the inert purge gas is argon, as shown in FIG. 1.

Generally speaking, a controlled amount of an oxidizing source gas mixture is injected into the stream of the inert purge gas for substantially complete oxidation of the silicon oxides. Preferably, the oxidizing source gas mixture is an argon-oxygen mixture. The argon-oxygen mixture is used in place of air in a controlled manner to avoid introduction of elevated levels of oxygen and nitrogen from air into the effluent 13. The argon-oxygen mixture may be introduced at a variety of locations. For example, the argon-oxygen mixture may be injected into the argon effluent 13 which emerges from the pullers 10. In another example, and, as shown in FIG. 1, the argon-oxygen mixture is injected at a predetermined location into the puller 10 at a point of exhaust location 53 therewithin. In FIG. 1, the effluent stream 13 which emerges from puller 10 includes argon purge gas withdrawn from puller 10 and the silicon-containing impurities that the purge gas has swept from out of the puller 10 along with the argon-oxygen mixture injected at location 53.

The argon is supplied from recycle stream 50. Recycle stream 50 preferably contains a concentration of nitrogen sufficiently low so as to not contaminate the silicon melt in the pullers 10 and facilitate separation of nitrogen from impure argon effluent 13 for the argon to be reused as purge gas or part of the oxidizing source gas mixture. In one embodiment, the nitrogen concentration is about 10 ppm or less. Any argon which may be lost during the recycle and purification system 100 can be replenished with fresh argon from argon supply tank 11, as shown in FIG. 1.

The oxygen source for SiO$_x$ oxidation is supplied from oxygen supply 21 through line 24 and into a mixer 52. Oxygen flow is controlled at a pre-determined rate by a flow control device 23, such as a flow orifice, restrictor or flow controller. The oxygen is preferably of high-purity and with a nitrogen concentration equal to or less than the nitrogen concentration (e.g., about 10 ppm or less) in argon supply tank 11.

The mixing of the argon-oxygen mixture will now be explained. Fresh argon from recycle stream 50 is controlled at a predetermined flow rate through use of flow control device 51 and then sent to the mixer 52. Oxygen from oxygen supply 21 is introduced into the mixer 52 where it mixes with argon from the recycle stream 50. The mixer 52 could be any suitable gas mixing device such as a venturi or other type of inline mixer. A sufficient amount of oxygen from the oxygen supply 21 source is mixed with argon in mixer 52 to ensure complete oxidation of the silicon oxide impurities to silicon dioxide when the argon-oxygen mixture is subsequently injected into the puller 10 at the point of exhaust location 53. In a preferred embodiment, the resultant mixture of argon and oxygen comprises levels of oxygen at 21%. The exact flow rate of oxygen is dependent, at least partially, upon the amount of SiO$_x$ generated in the puller 10. In one example, the flow rate of oxygen may range from about 0.1 to about 10 liters per minute, and more preferably about 0.2 to about 1 liters per minute per puller 10.

After sufficient mixing has occurred within mixer 52, the argon-oxygen mixture is injected into the puller 10 at the point of exhaust location 53. The flow rate of the argon-oxygen mixture is sufficient to allow complete oxidation of the SiO$_x$(g) to SiO$_2$(s) particulates but regulated at a relatively low flow rate to enable controlled in-situ oxidation of SiO$_x$(g) to SiO$_{2(s)}$ to reduce the risk of over pressurization caused by the instability and high reactivity of SiOx(g). In one example, the flow rate is about 1-2 liters per minute to allow a sufficient amount of oxygen for complete and controlled oxidation of SiOx(g).

The complete oxidation of SiO$_x$(g) forms SiO$_2$(s) particulates within the argon effluent stream 13. The SiO$_2$(s) particulates are removed in a conditioning unit 30, located downstream of the injection of the argon-oxygen mixture. The conditioning unit 30 preferably includes the steps of solid contaminant removal, liquid hydrocarbon removal, effluent redirection and compression. Solid contaminants, such as SiO$_2$ (s) particulates, as well any dopants or dopant compounds which may be present in the solid phase, can be removed by a particle filter device 31.

Unlike conventional techniques, the present invention provides an oxidizing source gas mixture substantially devoid of nitrogen (e.g., less than about 10 ppm) for a silicon crystal pulling process. The nitrogen content of the oxidizing source gas mixture is regulated to ensure that the nitrogen does not diffuse into the silicon melt and form an impurity such as silicon nitride. Substantial amounts of nitrogen are not generated in the system 100 which is believed to have many benefits. For example, it has been observed that the absence of nitrogen during the crystal pulling process produces a silicon ingot having a superior ingot quality. Additionally, the ability of the present invention to continuously inject the oxidizing source gas mixture at relatively low controlled flow rates avoids the significantly long post-oxidation periods encountered in the silicon crystal pulling industry.

It should be noted that the present invention, as shown in FIG. 1, is capable of continuously injecting the oxidizing source gas mixture in a once-through mode or a recycle mode. In the once-through mode, rather than utilize recycle argon stream 50, as was described above, fresh argon from source 11 is continuously supplied to mixer 52 to mix with oxygen from oxygen supply source 21 to create the oxidizing source gas mixture that is injected at location 53. After the SiO$_2$(s) particulates are removed by conditioning unit 30, the argon effluent stream 13 can be vented or collected without purification or recycle.

FIG. 1 shows that a portion of the fresh argon from source 11 may also be supplied directly to the crystal puller 10 as purge gas to sweep away impurities generated in the crystal pulling process. In one embodiment, the fresh argon from source 11 can compensate for a reduction in flow rate of purge gas, as shown by the line directly entering the puller 10 from the source 11. The source 11 also supplies fresh argon to mix in mixer 52 with oxygen from source 21 and form the resultant oxidizing gas mixture that is injected at location 53 for in-situ oxidation of the various impurities, including SiOx(g). In another embodiment, the fresh argon from source 11 can supply all of the purge gas requirements.

The present invention contemplates regulating the nitrogen content in the oxidizing gas source mixture to below a predetermined threshold. In particular, the nitrogen content in the fresh argon supplied from the source 11 may be periodically measured by a suitable analyzer to ensure the nitrogen is at or below an allowable nitrogen limit. If the nitrogen content is higher than a predetermined threshold that is allowed by argon specifications, the argon supply may not be qualified for silicon crystal growth. When detecting the higher nitrogen content, the fresh argon source 11 can be removed and replaced with another source 11. Alternatively, nitrogen may be periodically measured by installing a nitrogen analyzer downstream of the puller 10 to ensure elevated nitrogen levels are not being introduced into the silicon melt when the system 100 encounters a leak.

In another embodiment, which is also contemplated by FIG. 1, recycle argon stream 50 can be utilized for the oxidizing source gas mixture as well as the purge gas. However, the use of the recycle argon stream 50 requires purification of the argon effluent 13 that emerges from the puller apparatus 10. The process for purification of the effluent 13 will now be explained in greater detail, in accordance with the various embodiments shown in FIGS. 1-6.

Still referring to FIG. 1, heavy hydrocarbons, such as those that may be present from the use of an oil filled vacuum pump 32, can be removed by an oil mist separator or oil filter 33. In a preferred embodiment, an oil free pump is employed to avoid the introduction of oil in the argon effluent stream 13.

After solid particulates and any heavy hydrocarbons have been removed, the nitrogen and oxygen content of the effluent stream 13 are measured to ensure that they are below a predetermined threshold level prior to sending the effluent 13 to the purification unit 40. In this regard, FIG. 1 shows analyzer 34 located downstream of the conditioning unit 30 that monitors the nitrogen and oxygen impurity levels in effluent stream 13. The nitrogen and oxygen concentrations measured by analyzer 34 are communicated to a control system to determine whether to direct the effluent stream 13 into the purification unit 40. The nitrogen concentration in the effluent 13 should be lower than a predetermined value (e.g., about 10 ppm) for the effluent 13 to be directed into the purification unit 40. In one embodiment, when the nitrogen concentration is higher than about 6 ppm, the effluent 13 is sent to an exhaust system or vented to the atmosphere, as shown in FIG. 1. Accordingly, if the nitrogen content in the recycle stream 13 is higher than that allowed by argon specifications, this may be an indication of a system leak in puller 10, or the occurrence of $N_2$ induction in a known manner during crystal puller process.

Further, the oxygen concentration in the effluent 13 preferably should not exceed a predetermined threshold before the effluent 13 can be directed into the purification unit 40. Specifically, the oxygen concentration in the effluent 13 is preferably present in excess of the stoichiometric amount required to ensure complete catalytic conversion of CO, $H_2$ and hydrocarbons into $CO_2$ and $H_2O$ within the oxidation column 41, but not greater than a predetermined threshold when entering the subsequent adsorption beds 43. In the condition where the oxygen level is too low for the oxidation column 41, additional pure oxygen can be supplied into the purification oxidation column 41, as shown in FIG. 1, through the oxygen supply 21. Accordingly, the complete oxidation of CO, $H_2$ and hydrocarbons is attainable by system 100 without providing the oxygen in an excessive amount that is not suitable for the adsorption beds 43 located downstream of the oxidation column 41.

When the analyzer 34 detects concentrations of nitrogen (e.g., below about 6 ppm) and oxygen below a specific design limit, FIG. 1 shows that the effluent 13 is compressed by compressor 35 and thereafter directed into the purification unit 40. The effluent 13 enters oxidation column 41 where the hydrocarbons, CO and $H_2$ are converted into $CO_2$ and $H_2O$ using any suitable oxidation catalyst, such as, for example, a suitable metallic catalyst known in the art. In a preferred example, a platinum group metallic catalyst may be employed as known in the art. As previously mentioned, if necessary, additional oxygen from oxygen supply 21 can be added to ensure a stoichiometric excess amount of oxygen relative to the amount of CO, $H_2$ and hydrocarbons in the feed stream to the oxidation column 41. The additional oxygen ensures complete oxidation of the hydrocarbons, CO and $H_2$ contained in the effluent stream 13 to $CO_2$ and $H_2O$.

After oxidative reaction occurs within oxidation column 41, the argon effluent 13 exits oxidation column 41 and is directed into an adsorption unit 43. The adsorption unit 43 is a combination of a chemisorption bed, which adsorbs excess $O_2$, and a molecular sieve, which adsorbs $CO_2$ and $H_2O$. The purification unit 40 employed may be any suitable commercially available purifier, such as, for example, the PS-9 series purifier supplied by SAES.

There are preferably two beds in the adsorption unit 43. A first bed is employed for purification, and a second bed is employed for regeneration. The first and second beds alternate between purification and regeneration modes to allow for continuous purification. The adsorption unit 43 can be regenerated by back flushing with a stream 44, which may consist of a mixture of hydrogen and purified argon. Preferably, stream 44 is a mixture of hydrogen and nitrogen, as shown in FIG. 1. The mixture of hydrogen and nitrogen stream 44 can achieve a lower purification cost and increase the argon recovery rate relative to the hydrogen and purified argon back flushing mixture. Following regeneration of the adsorption unit 43, a side stream of purified argon can be purged through regeneration bed and vented to remove any residual nitrogen and hydrogen, and thereby avoid introduction of these contaminants into the recycled and purified argon stream 50.

Each of the impurities exiting the purification unit 40 is preferably reduced to the ppb level with the exception of nitrogen, which is not removed by the purification unit 40. In the absence of inadvertent air infiltration and contaminated source gases (e.g., oxygen supply source 21), the nitrogen concentration allowable in process 100 depends on the specifications of argon and oxygen supplied to the crystal pullers 10. In a preferred embodiment, the nitrogen concentration in process 100 is maintained below 10 ppm. Accordingly, when employing principles of the present invention, the relatively low nitrogen content, compared to conventional argon recycle processes in connection with silicon crystal pulling, advantageously does not adversely impact the silicon ingot quality. Furthermore, the inventive process 100 is cost effective as the separation of nitrogen from argon, which is energy intensive and costly process, is not necessary. However, to additionally safeguard the integrity of the process 100, in-line nitrogen and oxygen gas analyzers can be utilized to monitor the quality of argon gas in the system 100 and also to monitor maintenance of a leak tight system 100 in order to avoid undesirable air infiltration into the system 100.

Still referring to FIG. 1, purified argon stream 46 exits the adsorption bed of the adsorption unit 43. Analyzer 45 can be used to monitor the concentration of the impurities within the purified argon stream 46. The analyzer 45 may be a nitrogen and/or oxygen analyzer or a gas chromatograph. Unacceptably high levels of impurities, such as nitrogen and/or oxygen detected in the stream 46, will result in argon being vented to atmosphere through line 48, as shown in FIG. 1. Otherwise, the attainable concentration of argon in the purified argon stream 46 is preferably greater than 99.999 mol % with impurities for each of the components present in the ppb level with the nitrogen concentration equal to or less than the nitrogen concentration in the supplied argon sources.

Argon storage vessel 49 may collect the purified argon stream 46. The purified argon contained in vessel 49 may be recycled as stream 50 to be used in the crystal puller 10 via line 14. Alternatively, the purified argon stream 46 may pass through argon storage vessel 49 and be mixed with oxygen from oxygen supply 21 in mixer 52 for in-situ oxidation of silicon oxide impurities that are purged from the crystal pullers 10 with argon purge gas. Still further, a first portion of the purified argon may be recycled as stream 50 to be fed into the puller 10 via line 14 as purge gas. A second portion of the purified argon can be directed into mixer 52 to be mixed with oxygen from oxygen supply 21 to create the oxidizing gas mixture that is injected at location 53. Flow control device 51 regulates the flow rate of recycled argon 50 into the mixer 52. If the flow rate of the recycled stream 50 is below that which is required for the purge gas and/or the oxidizing source gas mixture, make-up liquid argon source 11 may be utilized as necessary to provide the required flow of argon gas.

Process 100 of FIG. 1 provides a cost-effective means for recycling argon as part of the growth of monocrystalline ingots. The ability to continuously provide argon in controlled amounts with an oxygen-containing gas to the effluent stream 13 increases throughput by eliminating the need for a separate post-oxidation step of $SiO_x$, which undesirably increases the length of the cycle. Further, the ability to achieve purification of the argon effluent stream 13 without cryogenic distillation significantly lowers operating costs of the process 100 compared to conventional methods for purifying argon. Still further, the low levels of nitrogen within process 100 eliminates the introduction of nitrogen impurities into the silicon melt, which is believed to adversely affect the monocrystalline silicon structure and properties.

Figure 2:
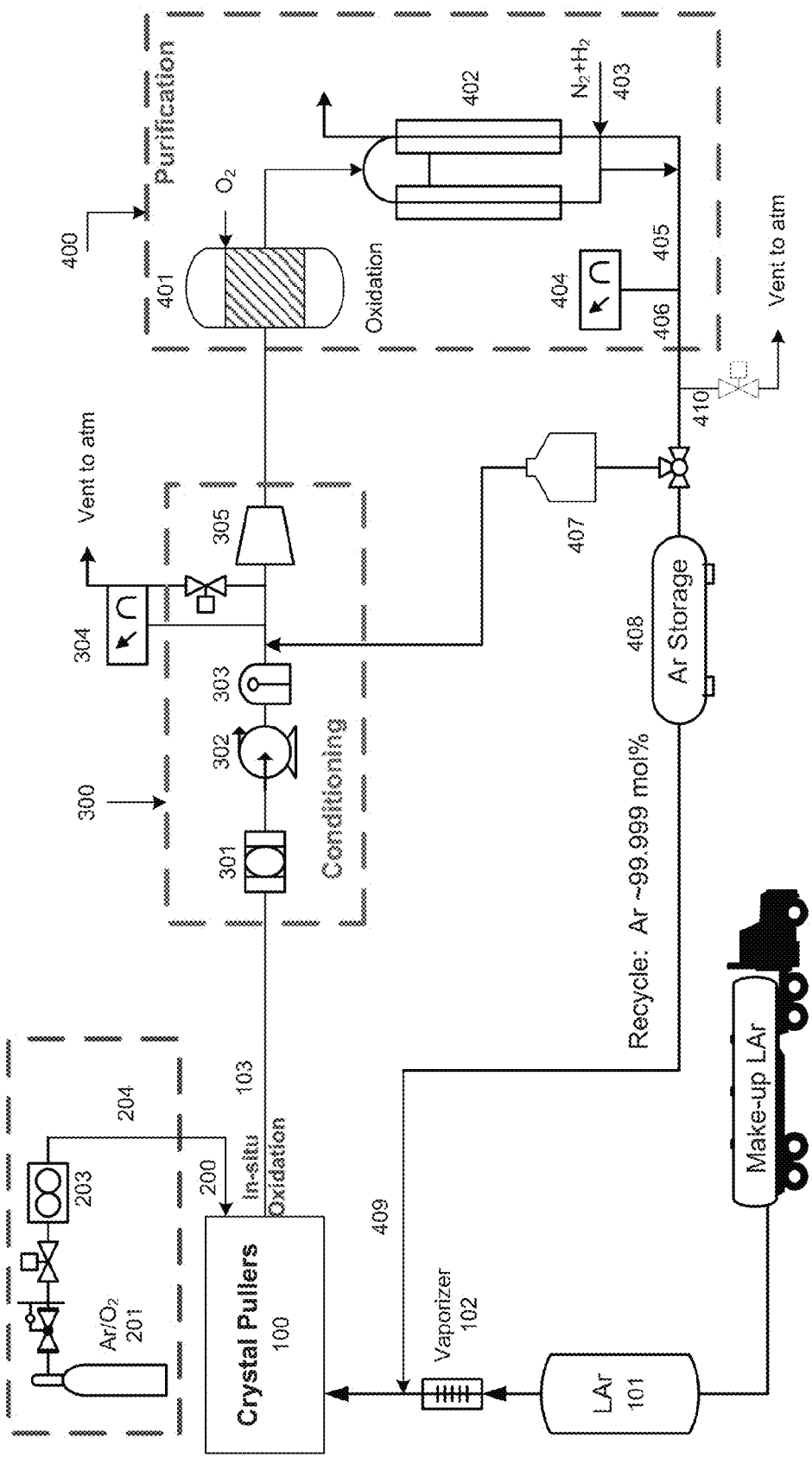
FIG. 2 shows an alternative process incorporating the principles of the invention in which pre-mixed argon and oxygen is supplied as the gas source for in-situ oxidation of silicon oxide impurities, and purified argon can be recycled into the crystal pullers as the gas source for purging impurities from therewithin.

As an alternative to mixing the requisite oxygen containing gas and argon at the point of use, FIG. 2 shows another embodiment in which the argon and oxygen can be premixed in the requisite proportions. Specifically, FIG. 2 shows a pre-mixed cylinder 201 which provides the required amount of oxygen within argon for oxidation of silicon oxides. Flow control device 203 regulates a controlled amount of pre-mixed argon-oxygen into the puller 100 at a predetermined point of exhaust location 200. In this embodiment, the nitrogen impurity in the argon-oxygen source mixture 201 is preferably less than about 10 ppm. More preferably, the nitrogen impurity in the cylinder 201 is less than about 6 ppm. The flow rate of the argon-oxygen pre-mix flow rate may be adjusted according to the oxygen concentration that is contained in line 103 downstream of the in-situ oxidation. As with the embodiment of FIG. 1, the oxygen concentration may be monitored through an in-line nitrogen/oxygen analyzer 304 located downstream of the conditioning unit 300. The $O_2$ concentration going into the oxidation column 401 is controlled to obtain complete oxidation of $SiO_x$ to $SiO_2$ within effluent line 103, and still retain a sufficient amount of $O_2$ for oxidation of CO, $H_2$ and hydrocarbons in the oxidation column 401 of the purification unit 400. The excess amount of oxygen is monitored and controlled to ensure compatibility with the adsorption beds 402.

In a particular embodiment of FIG. 2, if the oxygen or nitrogen concentration in the effluent 103 is greater than a predetermined value (e.g., about 10 ppm $N_2$ or greater than about 2500 ppm $O_2$), then the effluent stream 103 is directed to an exhaust system or vented to the atmosphere, as shown in FIG. 2. When the effluent 103 has less than 10 ppm $N_2$ and less than 2500 ppm $O_2$, the effluent 103 may be directed to a compressor 305 and subsequently purified by oxidation column 401 and adsorption bed 402 of purification unit 400, in a similar manner as described with the embodiment of FIG. 1. Additional oxygen may be supplied if necessary from the pre-mixed $Ar/O_2$ cylinder 201 into the oxidation column 401 for complete oxidation to occur within oxidation column 401. Alternatively, another high purity oxygen source containing less than about 6 ppm nitrogen may be supplied into oxidation column 401.

Upon exiting the purification bed of adsorption unit 402, analyzer 404 measures impurities, such as $N_2$, $O_2$ or CO, contained in the purified argon stream 405. If the purified argon stream 406 fails to meet the specification, such as that for $N_2$ required for the crystal pulling apparatus 100, the stream 406 can be vented to the atmosphere through line 410, as shown in FIG. 2. Alternatively, if the CO or $O_2$ concentration exceeds their respective predetermined values, the argon stream 406 can be directed to a storage tank 407 and, thereafter, redirected back to the conditioning unit 300 upstream of the $N_2/O_2$ analyzers 304 to combine with the main argon effluent stream 103. If the analyzer 304 detects nitrogen and oxygen levels which exceed those suitable for the purification unit 400, the stream can be vented to atmosphere. Otherwise, the combined stream (i.e., stream 406 and effluent 13) is sent to the purification unit 400. In this way, off-spec argon gas can be recovered.

If stream 406 is within acceptable purity levels, the argon storage vessel 408 may collect the purified and recycled argon stream 406. FIG. 2 shows that the purified argon contained in vessel 408 is completely recycled as stream 409 and then directed into the pullers 100 as argon purge gas. If the flow rate of the recycled stream 409 is below that which is required as purge gas for the pullers 100, make-up liquid argon source 101 may be utilized as necessary to provide the required flow of argon purge gas into pullers 100.

Figure 3:
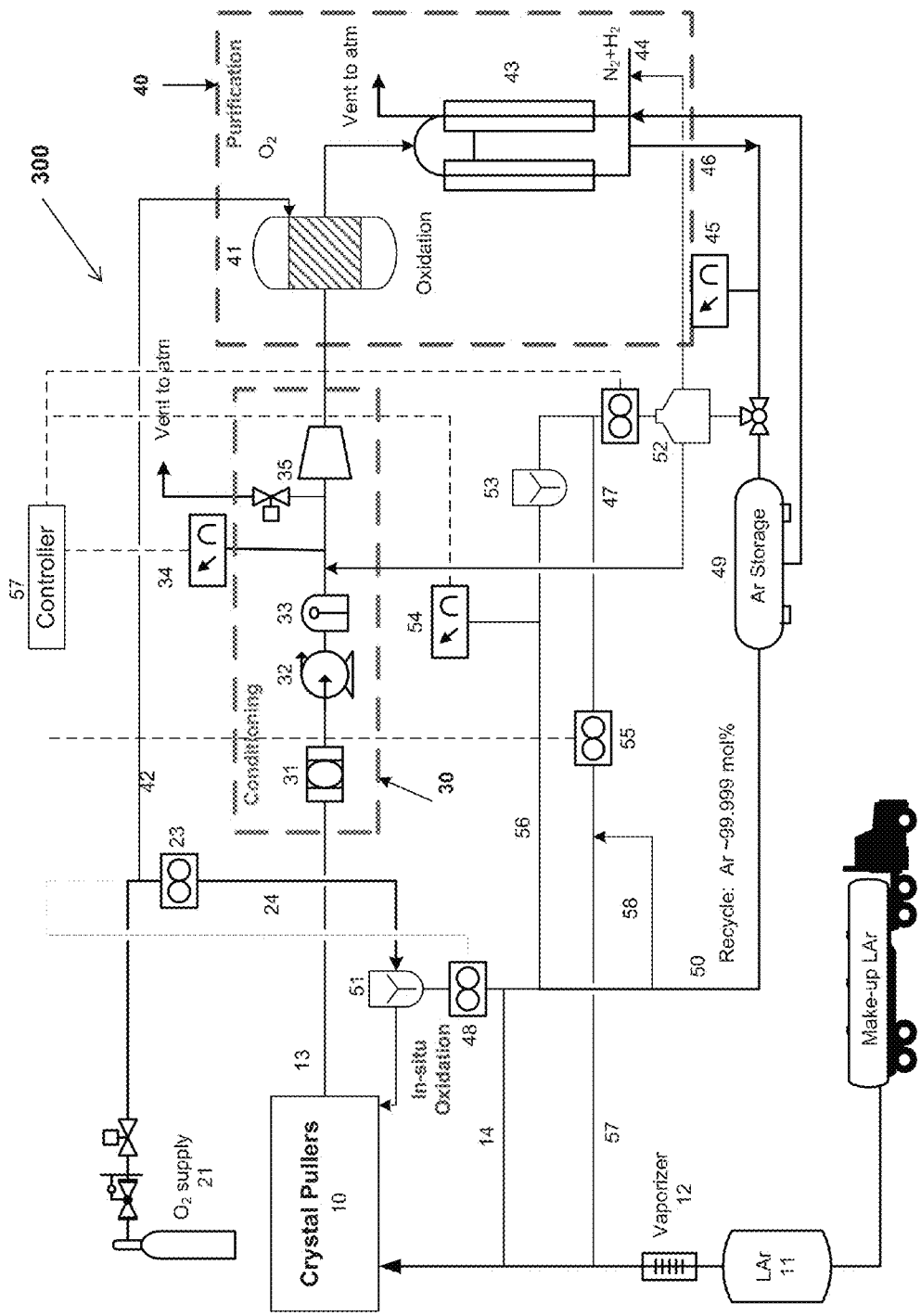
FIG. 3 shows an alternative process incorporating the principles of the invention for adjusting off-spec recycled argon to an acceptable purity level prior to recycling and blending with oxygen for in-situ oxidation of silicon oxide impurities.

FIG. 3 shows an embodiment for correcting the purity level of argon gas that is not within applicable limits after being processed once through the purification unit 40. The argon gas is considered off-spec as it cannot be recycled back to the crystal pullers 10 because the argon gas contains a nitrogen concentration which exceeds the level the purification unit 40 can remove. The embodiment of FIG. 3 corrects for such off-spec gas. Specifically, in-line analyzer 45 measures the concentration of a key component, such as nitrogen or oxygen, of the argon stream 46 exiting the purification bed of adsorption unit 43. When the nitrogen concentration is not within specification (e.g., exceeds more than about 10 ppm), the off-spec stream 46 will be redirected to an argon storage tank 52. Mixer 53 blends the off-spec argon stream from storage tank 52 with fresh argon gas from make-up source tank 11 through line 57 and/or with recycled, purified argon gas from storage tank 49 through line 58. The mixer 53 can be any type of suitable gas mixer known in the art. Analyzer 54 is arranged downstream of the mixer 53 and monitors the concentration of nitrogen in the blended mixture exiting the mixer 53. The monitored information is fed from the analyzer 54 to a controller 57, which uses this information to validate and adjust, if necessary, at least one of the source gas flow rates to maintain the nitrogen concentration less than about 10 ppm or, more preferably, less than about 6 ppm. When the nitrogen concentration is below this level, the blended mixture exits mixer 53 as stream 56, which is sent to the crystal pullers 10. Additional make-up argon from source tank 11 can be mixed with the recycled argon if a higher flow rate of argon is required, for example, as purge gas for the crystal pullers 10.

Still referring to FIG. 3, the recycled argon 50, along with fresh argon if needed, can also be mixed with high purity oxygen from oxygen supply 21 in mixer 51 prior to being injected into the puller 10 point of exhaust for the in-situ oxidation of $SiO_x$ to $SiO_2$. The high-purity oxygen supply 21 has a nitrogen impurity concentration that is equal to or less than that in the argon supply, preferably less than about 6 ppm. After in-situ oxidation has occurred in the argon effluent stream 13, analyzer 34 monitors the $O_2$ concentration of the stream 13. If the $O_2$ concentration exceeds an allowable limit, for example, greater than about 2500 ppm or another design limit, then the argon effluent 13 will be vented to the atmosphere. Otherwise, the effluent 13 can be compressed by compressor 35 to about 100-150 psi before entering the oxidation column 41 of the purification unit 40.

In another embodiment of FIG. 3, the nitrogen-containing purified argon gas in storage tank 52 can also be used as regeneration gas for the adsorption unit 43 of purification system 40 when the nitrogen concentration exceeds an allowable limit suitable for blending and recycling back to the crystal growth pullers 10 as an oxidizing gas source and/or purge gas. Such regeneration use may reduce the amount of nitrogen needed for regeneration, thereby avoiding the inadvertent introduction of nitrogen into the process of FIG. 3.

Figure 4:
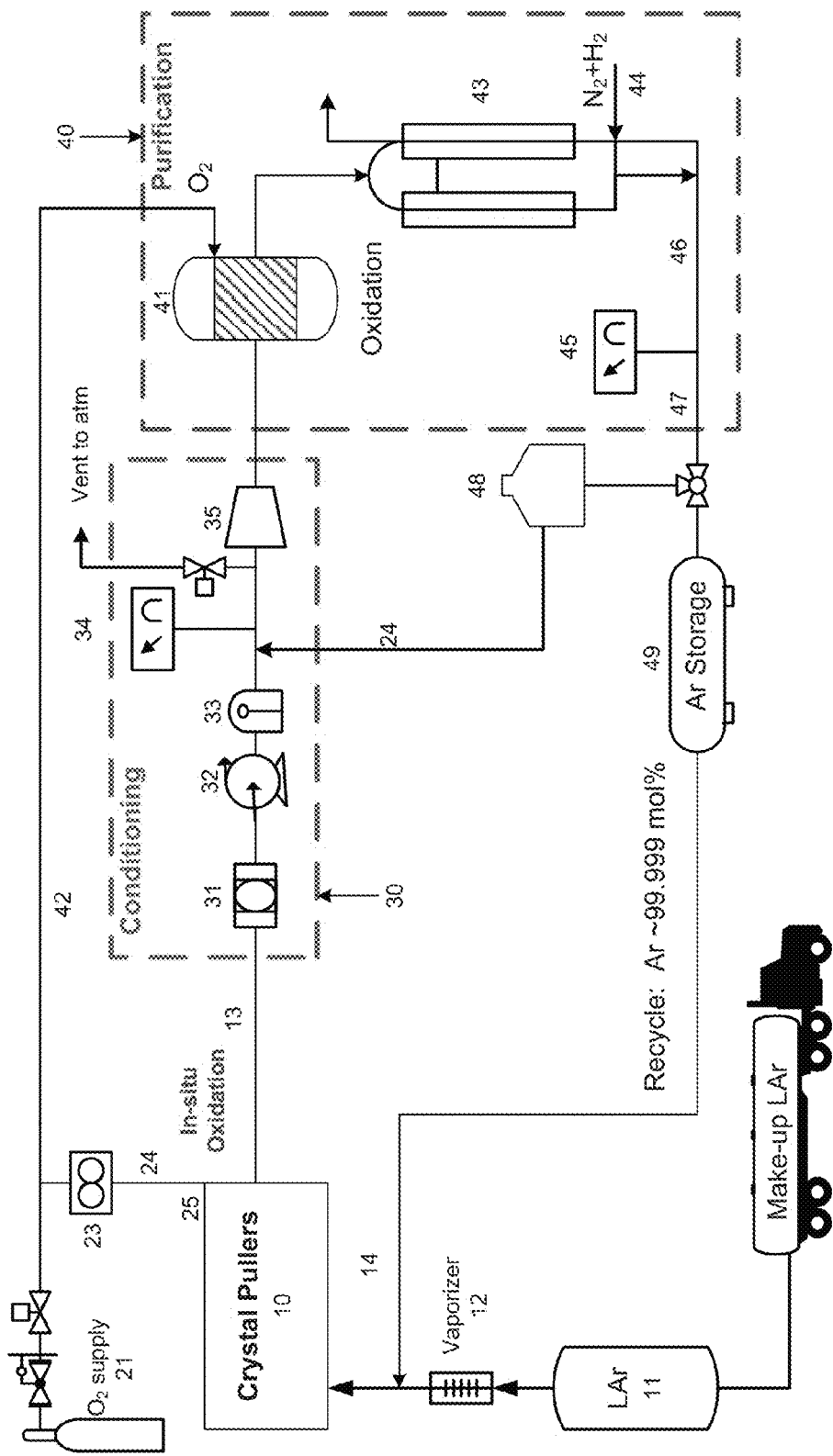
FIG. 4 shows an alternative process incorporating the principles of the invention in which pure oxygen is used as the gas source for in-situ oxidation of silicon oxide impurities.

As has been described, various oxygen-containing gases can be employed for in-situ oxidation of $SiO_x(g)$ to $SiO_2(s)$. In one embodiment, pure oxygen gas can be utilized, as shown in FIG. 4. Pure oxygen is provided from oxygen supply source 21. The pure oxygen is injected through line 24 at a controlled flow rate into the argon effluent stream 13 at the point of exhaust 25 of crystal pullers 10. The flow rate of the pure oxygen is controlled with flow control device 23, such as a flow orifice or restrictor, volume or mass flow controller. The exact flow rate may be regulated according to the amount of $SiO_x$ impurities generated in the crystal pullers 10 and purged therefrom.

Various purification units, in addition to the catalytic oxidation column 41 and adsorption unit 43 described above, are contemplated by the present invention. The selection of a suitable purification technology depends on numerous factors, including, but not limited to, the type of inert purge gas being recycled and purified, the off-gas impurities generated in the silicon crystal pulling process and the inlet feed gas composition to the purification unit. In one example, argon effluent 13 may be recycled and purified with an argon purification unit 40 (i.e., oxidation column and adsorption column) as shown in FIG. 3 or 4 and a cryogenic distillation unit to separate $N_2$ from purified argon. After the $SiO_x$ in effluent has been fully oxidized to $SiO_2$ particulates and thereafter removed by effluent 13, the substantially particulate-free effluent 13 stream may be introduced into an argon purification unit 40 as shown in FIG. 3 or 4 to remove impurities therein, such as $O_2$, $CO/CO_2$, $H_2$, hydrocarbons and $H_2O$, with the exception of $N_2$. The argon effluent is then passed into a cryogenic distillation column, as commonly known in the art. The cryogenic distillation column separates the incoming argon gas stream from nitrogen depending on the relative boiling points of the components contained therein. Because nitrogen is not deliberately introduced into the recycle system, several process benefits with a distillation approach may be possible, such as, for example, a smaller distillation column with less trays which is not as energy intensive as typical columns employed for separating nitrogen from argon in conventional argon recycle and purification processes. Accordingly, the operating cost may be substantially less for the distillation column utilized in the present invention compared to conventional argon recycle and purification processes which must be capable of separating higher concentrations of nitrogen from argon.

Figure 5:
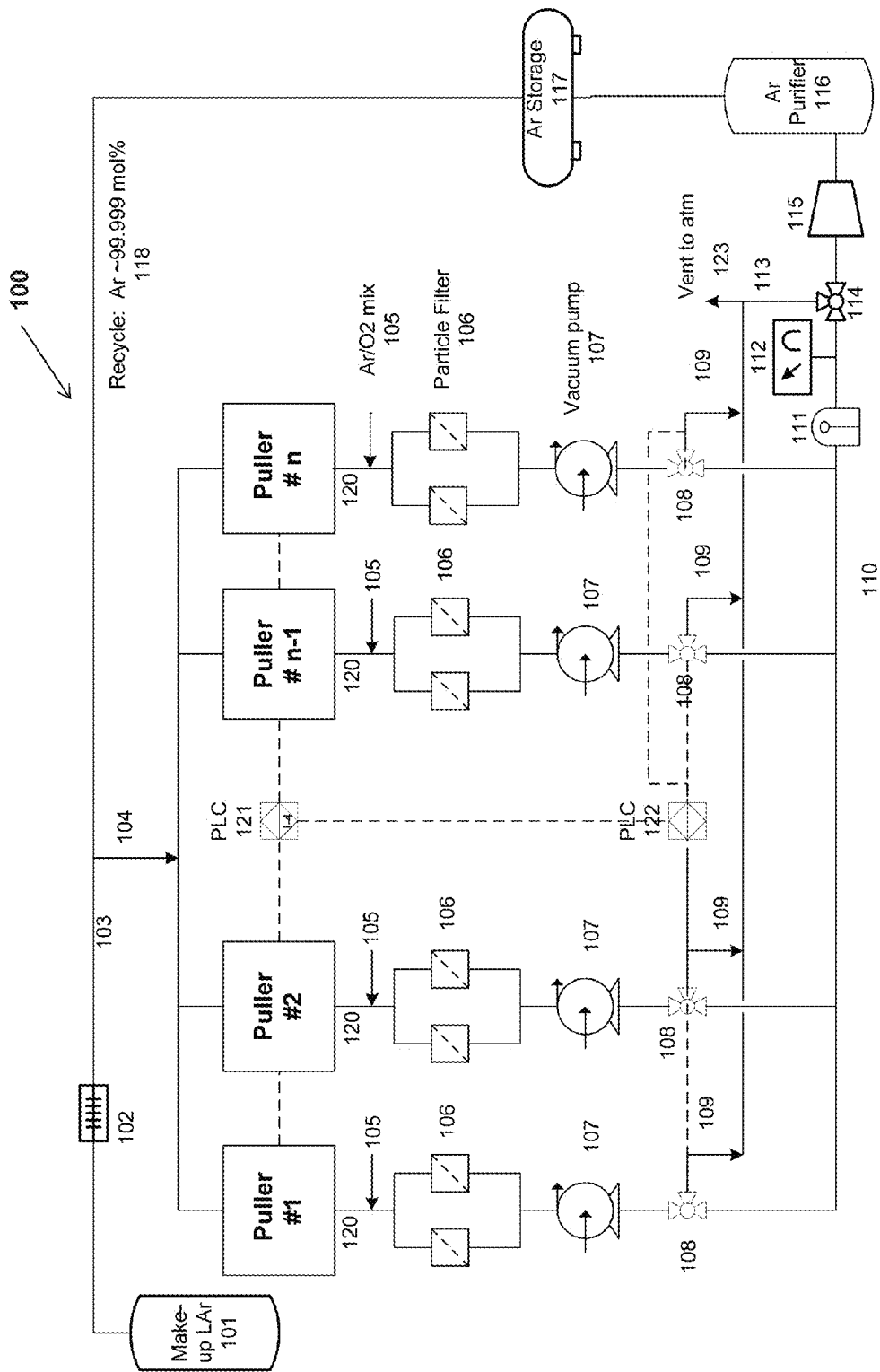
FIG. 5 shows an alternative process incorporating the principles of the invention of a fab-integrated argon recycle system for multiple pullers with each puller having an effluent stream directed to either a main stream for purification or to a main exhaust.

The present invention may also be utilized with multiple pullers. FIG. 5 shows a fab-integrated design in which multiple pullers are exhausted into a central recovery/recycle system 100. The argon effluent 120 emerges from each of the crystal pullers 1 to n. The argon effluent 120 from each of the pullers 1 to n mixes with an argon-oxygen supply from line 105 to oxidize $SiO_x$ into $SiO_2$ particulates. In accordance with the previously discussed embodiments, the argon-oxygen supply can be a premixed cylinder of $Ar/O_2$, or mixed at the point of use with relative proportions of argon and oxygen. Alternatively, oxygen can be supplied from line 105 to meet oxygen requirements for the oxidation. The oxidized $SiO_2$ particulates contained within each of the argon effluent streams 120 are then removed in a corresponding particle filter 106.

Because the present invention does not introduce nitrogen into the process 100, the presence of elevated levels of nitrogen and/or oxygen may occur as a result of intentional introduction of oxygen and/or nitrogen during the crystal pulling process, such as during polycrystalline silicon replenishment into the crucible of one or more pullers from 1 to n. When such elevated levels of oxygen and/or nitrogen are detected in at least one of the pullers 1 to n, the argon effluent 120 from that particular puller 1 to n during this occurrence of silicon replenishment can be vented through line 123 to the exhaust. This venting occurs by integrating the control system 122 for valve 108 with the puller control system 121, as shown in FIG. 5.

After the SiO2 particulates from the effluent 120 are removed by the respective filter 106, each of the effluent streams 120 from their respective puller 1 to n converges into a single recycle stream 110, which passes through oil filter 111 to remove any hydrocarbon contaminants prior to an analyzer 112 detecting impurities within the stream 110. In this embodiment, a single analytical system 112 can be employed by installing valve 108, as shown in FIG. 5, which is installed downstream of each vacuum pump 107 corresponding to each puller 1 to n. Valve 114 may be opened to vent argon recycle stream 110 when analytical system 112 detects impurities outside specification limits.

When the argon recycle stream 110 is within specification, the stream 110 is directed to a compressor 115 where it is compressed to the pressure required for the argon purifier 116 (e.g., PS-9 inert gas purifier from SAES). The compressed argon gas stream 110 enters purifier 116 where it undergoes purification, as explained in the previous embodiments. Purified argon is stored in the argon storage tank 117. The recycled argon 118 is directed back to the pullers 1 to n via argon supply main stream 104. Make-up argon may be supplied to compensate for a deficiency in argon supply to the pullers 1 to n. In particular, make-up liquefied argon from supply source 101 may be vaporized by vaporizer 102 and thereafter supplied along line 103 to join with recycle stream 118 at line 104.

Although the above described embodiments have been described in conjunction with argon recovery, purification and recycle, it should be understood that the principles embodying the present invention can be utilized with any type of inert gas suitable for use as a purge gas within the crystal pullers. In one example, the inert gas may be helium.

Figure 6:
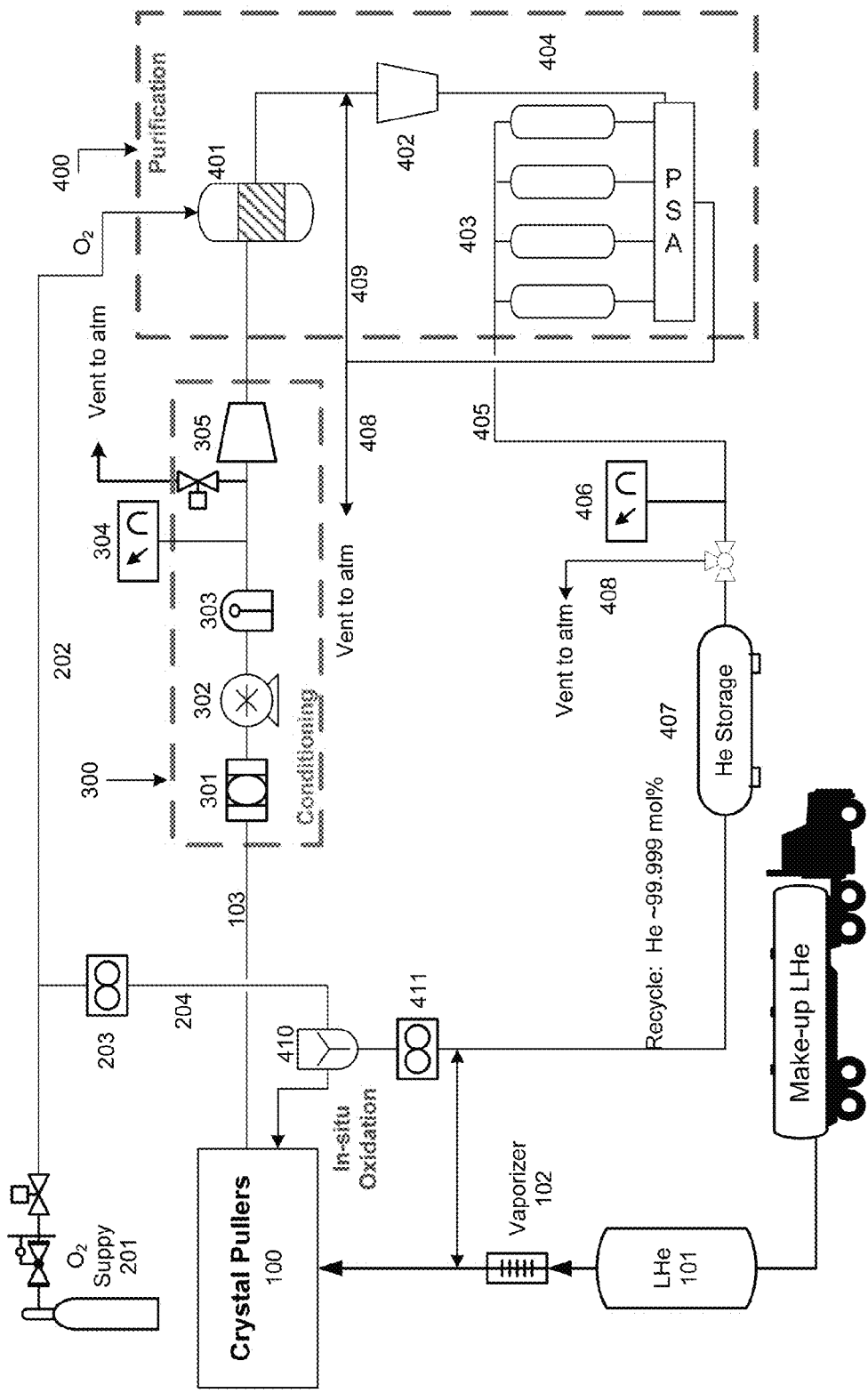
FIG. 6 shows an alternative process incorporating the principles of the invention in which helium is used as a purge gas and thereafter purified through a pressure swing adsorption process for purification and recycle.

FIG. 6 shows an example of a process which may utilize helium as the purge gas and the oxidizing source gas mixture. Helium effluent 103 emerging from the crystal puller 100 undergoes in-situ oxidation utilizing an oxidizing source gas mixture, as previously mentioned. $SiO_x$ is oxidized to $SiO_2$ particulates, which are subsequently removed in a conditioning unit 300, as previously described. The oxidizing source gas mixture may include high-purity oxygen or a blend of high-purity oxygen with helium.

Helium effluent 103 devoid of $SiO_2$ particulates can be recycled and purified in purification unit 400 when analyzer 304 determines that the effluent 103 is at or below acceptable specification limits for various constituents, such as, for example, nitrogen and oxygen. The purification unit 400 includes an oxidation column 401 to oxidize $H_2$ into $H_2O$ with $O_2$ over a catalyst, such as palladium catalyst as known in the prior art. The unit 400 also includes a downstream pressure swing absorption (PSA) unit 403 to remove $CO/CO_2$, $CH_4$ or hydrocarbons, $N_2$, $O_2$ and $H_2O$ by passing through different layers in the adsorption columns.

When effluent 103 is determined by analyzer 304 to be at or below acceptable specification limits, the helium effluent 103 is compressed with a compressor 305 to a desired pressure and is then directed to the oxidation column 401 in the presence of excess oxygen to completely oxidize impurities, including hydrogen, generated as by-products in the crystal puller 100. The hydrogen-deficient helium gas stream is then cooled. Any condensed water may be removed through an optional separator (not shown).

The helium gas stream exits oxidation column 401 and enters the inlet of compressor 402 to become compressed to a desired operating pressure for the PSA 403. The compressed helium gas stream enters PSA unit 403 to remove by adsorption the gas-phase impurities (e.g., $H_2O$, $CO/CO_2$, $CH_4$, $O_2$ and $N_2$). The adsorbent bed contained in PSA unit 403 may comprise different layers for removing different contaminants. High-purity helium from PSA unit 403 can be recycled to the crystal puller 100 and/or blended with oxygen from oxygen supply 201 for in-situ oxidation of $SiO_x$ to $SiO_2$ particulates.

The purified helium gas emerges from the PSA system as stream 405. Stream 405 is analyzed for $N_2$ and $O_2$ impurity level in analyzer 406. If the impurity levels are within specification, the helium is directed to helium storage tank 407. Purified helium in tank 407 can be recycled to the crystal puller 100 and/or mixed with a predetermined amount of $O_2$ in the mixer 410 to produce an oxidizing source gas mixture suitable for substantially complete SiOx in-situ oxidation.

FIG. 6 shows that the oxidizing source gas mixture can be introduced at the puller 100 at a point of exhaust location.

If stream 405 is detected by analyzer 406 to not be within acceptable specification for recycle, the stream 405 can be vented to the atmosphere through line 408. A portion of helium containing waste gas from the PSA unit 403 may also be vented via line 408 when impurity concentrations have accumulated within the PSA unit 403 to a level higher than the designed adsorption column capacity. The venting from the PSA unit 403 may also occur to balance the amount of impurities in the total system of FIG. 6 with the impurities coming from the crystal puller 100.

Advantageously, in accordance with the principles of the present invention, the nitrogen and oxygen content in the helium effluent stream 103 will be significantly lower than using air for in-situ oxidation of $SiO_x$ produced from a silicon crystal puller. In one example, the effluent stream 103 at the inlet to the PSA unit 403 may be less than 50 ppm nitrogen and less than 500 ppm oxygen. By comparison, the utilization of air for oxidation of $SiO_x$ even with flow control would typically have 1-2% $N_2$ and $O_2$. Accordingly, the PSA purification unit 403 for this crystal pulling application can process a higher amount of the effluent stream 103 per unit weight of adsorbent of the PSA unit 403, in which the helium rich effluent stream 103 can be more than 99% pure, with $N_2$ and $O_2$ concentrations sufficiently low so as to not adversely impact the silicon melt and final crystal structure before going into the purification unit 400.

The amount of helium discarded during the purification process of FIG. 6 is relatively small. In one example, a helium recovery rate of greater than 95%, and preferably greater than 98%, can be achieved. One of the advantages of using helium as compared to argon in the embodiment of FIG. 6 is that higher levels of nitrogen can be removed from the helium effluent 103 in a PSA unit 403. As a result, the relatively higher recovery efficiency significantly reduces the cost of fab-integration for the helium effluent recycle system. Accordingly, the use of a helium effluent purification and recycle system in connection with a silicon crystal pulling process, when utilized in accordance with the principles of the present invention, becomes a cost effective solution.

COMPARATIVE EXAMPLE

Table 1 below shows the impurity concentrations of three samples of argon effluent obtained from a Si crystal growth furnace when air was utilized as the source of oxidizing $SiO_x$ impurities to $SiO_2$ particulates. Air was injected into the effluent in a crystal puller at a point of exhaust location. Three samples were obtained after injection of air. Each of the three samples was obtained at different processing times during crystal growth. A downstream purification unit was not installed in this test run, as the air was utilized in a once-through set-up.

The nitrogen concentration in the argon effluent was measured to be about 2% for each of the three samples. The $O_2$ concentration was measured to be about 7000 ppm for each of the three samples. Because of the elevated levels of nitrogen and oxygen detected in the effluent, purification would not be feasible if a downstream purification unit had been installed in this test run.

Further, a large amount of CO was observed in the samples as a result of the reaction of oxygen with the graphite susceptor supports. Small amounts of $H_2$ and hydrocarbons were also observed.

TABLE 1

Impurity concentrations of Ar effluent from a Si crystal puller as a result of utilizing air for in-situ oxidation

| Sample | $N_2$, % | $O_2$, % | CO, ppm | $CO_2$, ppm | $H_2$, ppm | THCs, ppm |
|---|---|---|---|---|---|---|
| 1 | 2.3 | 0.67 | 1080 | 69 | 30 | 55 |
| 2 | 2.2 | 0.63 | 940 | 66 | 19 | 70 |
| 3 | 2.2 | 0.72 | 560 | 70 | 15 | 64 |

Example 1

A premixed sample of argon and oxygen in accordance with principles embodying the present invention was used to replace the air that was utilized as the oxidizing gas source in the Comparative Example. The concentration of oxygen in the mixture was about 21%. The argon-oxygen mixture was injected into the puller at the point of exhaust at a controlled flow rate. The purpose of this test run was to evaluate the sustained ability of the process to maintain low levels of nitrogen and oxygen in the effluent during a silicon crystal pulling process. In-line $N_2$ and $O_2$ analyzers were installed to monitor the $N_2$ and $O_2$ levels in the argon effluent.

The $O_2$ concentration was controlled by adjusting the flow rate using a mass flow controller in accordance with the in-line $O_2$ analyzer readings that were obtained in the argon effluent downstream of the in-situ oxidation.

Figure 7:
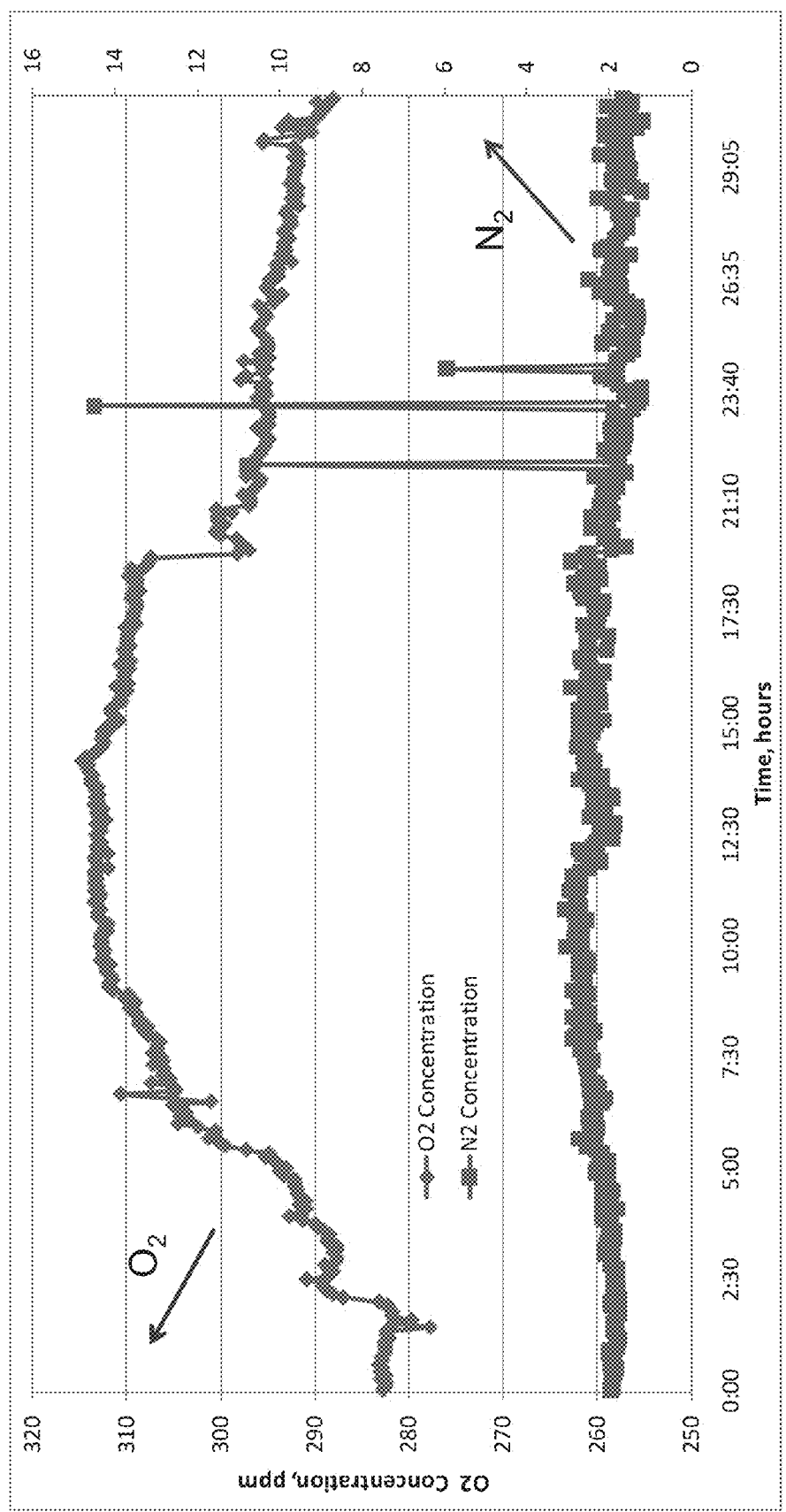
FIG. 7 shows a graph of the oxygen and nitrogen concentrations observed in the argon effluent when a mixture of argon and oxygen was injected into the puller point of exhaust for silicon oxide in-situ oxidation during approximately 30 operating hours of silicon crystal growth when a single crystal puller was utilized.

FIG. 7 shows a graph of the $O_2$ and $N_2$ concentrations observed in the argon effluent during approximately 30 operating hours of silicon crystal growth in a single crystal puller. Compared to the results in Table 1 obtained from the injection of air, the $O_2$ and $N_2$ concentrations in the effluent argon stream were significantly reduced. $N_2$ concentrations in the argon effluent were measured to be on average, approximately 2 ppm during the 30 hours of crystal growth with the exception of three (3) data points, as shown in FIG. 7, which were attributable to normal system perturbations, such as induced by electric surge or vibration. The measured oxygen concentration varied in a relatively narrow band of about 280 ppm to about 320 ppm. While a purification unit was not installed during this test run, it is of significance to note that the sustained levels of nitrogen and oxygen detected in the argon effluent as shown in FIG. 7 were sufficiently low to be removable in the purification unit consisting of the catalytic oxidation and adsorption units that have been described and shown in the various embodiments.

The remaining impurities, including CO, $H_2$ and hydrocarbons generated in the crystal puller during the crystal growth process, could be oxidized with a oxidation column as has been described in the various embodiments, and, thereafter removed with an adsorption bed. The average CO concentration was measured to be about 860 ppm. The average concentration of $H_2$ was measured to be 21 ppm. The hydrocarbons, reported as a methane equivalent, were measured to be about 63 ppm. The total concentration of CO, $H_2$ and hydrocarbons was about 1000 ppm.

The average $O_2$ concentration was about 300 ppm after replacing air with the mixture of argon and oxygen. Such a level of oxygen may not be sufficiently in excess for the oxidation reaction in the oxidation column to completely occur. As a result, excess $O_2$ may need to be added for the catalytic oxidation reaction to occur to completion so that CO, $H_2$ and the hydrocarbons would be fully oxidized into $CO_2$ and $H_2O$.

It was observed that the silicon ingot quality was superior to that produced when utilizing air in the Comparative Example. This favorable observation may be attributable to minimizing the introduction of elevated levels of nitrogen, which is believed to diffuse into the silicon melt as a nitride impurity which can adversely impact the silicon crystalline structure and properties.

The sustained low levels of nitrogen and oxygen in the argon effluent during in-situ oxidation of the silicon oxides would make the current process compatible with a distillation unit. The sustained low levels would also be compatible with a two-step purification unit comprising a catalytic oxidation column and adsorption unit. Consequently, purification of an argon gas effluent on a continuous basis of the crystal pulling process would be possible in which the argon concentration could be more than about 99% in the argon effluent before entering a catalytic oxidation and adsorption purification process. The argon purity attained after the purification process would be of sufficiently high purity to be recycled to the silicon crystal growth furnace and blended with oxygen-containing gas for in-situ oxidation of silicon oxides, without introduction of nitrogen contaminants, at levels exceeding acceptable limits, into the crystal pullers or the argon effluent. Accordingly, the ability to recover, purify and recycle the argon effluent would result in lower silicon crystal operating costs for manufacturers without any compromise on the silicon crystal quality produced.

While it has been shown and described what is considered to be certain embodiments of the invention, it will, of course, be understood that various modifications and changes in form or detail can readily be made without departing from the spirit and scope of the invention. It is, therefore, intended that this invention not be limited to the exact form and detail herein shown and described, nor to anything less than the whole of the invention herein disclosed and hereinafter claimed.

The invention claimed is:

1. A method for purifying and recycling argon into a silicon crystal pulling apparatus, comprising the steps of:
   withdrawing an impure argon stream from a hot zone of the silicon crystal pulling apparatus, the impurities comprising silicon oxides, hydrocarbons, carbon monoxide, oxygen and hydrogen generated from the silicon crystal pulling apparatus;
   injecting into the impure argon stream a controlled flow of an oxidizing source gas mixture, the oxidizing source gas mixture being characterized by a nitrogen concentration of less than a predetermined threshold;
   oxidizing substantially all silicon oxide impurities in the impure argon stream to produce silicon dioxide particulates;
   removing the particulates in a conditioning unit;
   regulating a nitrogen concentration of the impure argon stream to be no greater than a nitrogen predetermined threshold prior to entering a purification unit;
   regulating an oxygen concentration of the impure argon stream prior to entering a purification unit such that the oxygen concentration is present in excess of a stoichiometric amount required to ensure complete oxidation of the impurities, but not greater than an oxygen predetermined threshold when entering the subsequent adsorption beds of a purification unit;
   oxidizing the hydrocarbons, carbon monoxide and hydrogen in the purification unit to produce oxidized impurities comprising water and carbon dioxide;
   removing the oxidized impurities and the $O_2$ concentration that is present in excess of the stoichiometric amount to generate a purified stream of argon; and
   recycling at least a portion of the purified stream of argon from the purification unit into the crystal pulling apparatus;
   wherein a first portion of the purified stream of argon is recycled into the pulling apparatus and a second portion is blended with the oxidizing source gas mixture.

2. The process of claim 1,
   wherein the step of injecting into the impure argon stream a controlled flow of the oxidizing source gas mixture, produces an effluent stream located downstream of the hot zone of the pulling apparatus; followed by
   directing the effluent stream to an analyzer located downstream of the conditioning unit; and
   measuring the nitrogen concentration of the effluent stream, whereby the effluent stream is directed to the purification unit when the measured nitrogen content is below the predetermined threshold, and the effluent stream is vented to an exhaust when the effluent stream exceeds the predetermined threshold.

3. The process of claim 2, further comprising the steps of:
   measuring the nitrogen content to determine whether the nitrogen concentration is below the predetermined threshold;
   directing the effluent stream into a catalytic oxidation unit having a sufficient amount of excess oxygen when the nitrogen concentration is determined to be below the predetermined threshold; and
   oxidizing at least a portion of the oxidized impurities to water and carbon dioxide.

4. The process of claim 2, wherein the purification unit comprises a distillation unit.

5. The process of claim 3, further comprising the steps of:
   withdrawing the oxidized impurities from the catalytic oxidation unit;
   feeding the oxidized impurities into an adsorption bed;
   adsorbing the oxidized impurities and excess oxygen; and
   withdrawing a stream of purified effluent.

6. The process of claim 5, further comprising the steps of:
   detecting whether the purity level of the purified effluent is less than a specified purity limit;
   mixing fresh argon effluent with the impure argon stream above the specified purity limit to increase the purity level to at least within the specified purity limit when the purity of the purified effluent is less than the specified purity limit; and
   recycling at least a portion of the effluent with the increased purity level into the crystal pulling apparatus.

7. The method of claim 2, further comprising co-introducing fresh argon effluent from a make-up supply source into the oxidizing source gas mixture when the flow rate of a recycled stream is below that which is required for the oxidizing source gas mixture.

8. The method of claim 2, the oxidizing source gas mixture comprising fresh argon or recycled argon mixed with pure oxygen, wherein the nitrogen content in the fresh argon or the recycled argon is at or less than the predetermined threshold, and the nitrogen content in the pure oxygen is at or less than the predetermined threshold.

9. The method of claim 1, wherein substantially all of the purified argon is recycled into pulling apparatus.

10. The method of claim 1, further comprising introducing fresh make-up argon into the silicon crystal pulling apparatus.

11. The method of claim 1, wherein the step of regulating the oxygen concentration comprises the steps of:
   measuring the oxygen concentration in the impure argon gas stream, wherein the oxygen concentration is measured at a location downstream of the location where the oxidizing source gas mixture is fed; and providing oxygen in excess of a stoichiometric amount needed to completely oxidize silicon oxides to silicon dioxide but not greater than a predetermined oxygen threshold when entering a purification unit.

12. The method of claim 1, wherein additional oxygen is added into an oxidation column in the purification unit to compensate for the oxygen concentration in the impure argon gas stream entering the purification unit.

13. The method of claim 1, wherein the step of regulating a nitrogen concentration of the impure argon stream prior to entering a purification unit comprises:

measuring the nitrogen content of the impure argon stream, whereby the impure argon stream is directed to the purification unit when the measured nitrogen content is below the predetermined threshold, and the impure argon stream is vented to an exhaust when the impure argon stream exceeds the predetermined threshold of nitrogen.

14. The method of claim 13, wherein the nitrogen predetermined threshold is less than about 10 ppm.

15. The method of claim 11, wherein the oxygen predetermined threshold is less than about 2500 ppm.

16. A method for purifying and recycling argon into a silicon crystal pulling apparatus, comprising the steps of:

withdrawing an impure argon stream from a hot zone of the silicon crystal pulling apparatus, the impurities comprising silicon oxides, hydrocarbons, carbon monoxide, oxygen and hydrogen generated from the silicon crystal pulling apparatus;

injecting into the impure argon stream a controlled flow of an oxidizing source gas mixture, the oxidizing source gas mixture being characterized by a nitrogen concentration of less than a predetermined threshold;

oxidizing substantially all silicon oxide impurities in the impure argon stream to produce silicon dioxide particulates;

removing the particulates in a conditioning unit;

regulating a nitrogen concentration of the impure argon stream prior to entering a purification unit;

regulating an oxygen concentration of the impure argon stream prior to entering a purification unit;

oxidizing the hydrocarbons, carbon monoxide and hydrogen to produce oxidized impurities comprising water and carbon dioxide;

removing the oxidized impurities and the excess $O_2$ to generate a purified stream of argon; and recycling at least a portion of the purified stream of argon from the purification unit into the crystal pulling apparatus;

wherein the oxidizing source gas mixture is high-purity oxygen comprising less than about 10 ppm nitrogen.

17. The method of claim 16, wherein the step of removing the impurities comprises a pressure swing absorption process.

18. The method of claim 16, further comprising:

detecting an elevated oxygen concentration or an elevated nitrogen concentration in an effluent stream in the pulling apparatus;

relaying the elevated oxygen concentration or the elevated nitrogen concentration to a first control system in communication with the pulling apparatus;

relaying a signal to a second control system in communication with a valve corresponding to the pulling apparatus;

transmitting the signal to the valve corresponding to the pulling apparatus incurring the elevated oxygen or the elevated nitrogen concentration; and configuring the valve to a vent position to vent the effluent stream.

* * * * *